(12) United States Patent
Goto

(10) Patent No.: US 8,913,403 B2
(45) Date of Patent: Dec. 16, 2014

(54) POWER CONVERTER

(75) Inventor: Shinya Goto, Gifu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/552,234

(22) Filed: Jul. 18, 2012

(65) Prior Publication Data

US 2013/0021771 A1 Jan. 24, 2013

(30) Foreign Application Priority Data

Jul. 18, 2011 (JP) ................................. 2011-157323

(51) Int. Cl.
*H05K 9/00* (2006.01)

(52) U.S. Cl.
CPC .................................. *H05K 9/0037* (2013.01)
USPC ......................................... 361/816; 361/818

(58) Field of Classification Search
USPC .................. 361/816, 818, 800; 174/350, 377
See application file for complete search history.

(56) References Cited

U.S. PATENT DOCUMENTS

| 3,014,189 | A | * | 12/1961 | Lloyd et al. ..................... 336/87 |
| 5,053,920 | A | * | 10/1991 | Staffiere et al. ............... 361/694 |
| 2005/0083665 | A1 | | 4/2005 | Nakashima et al. |
| 2008/0205089 | A1 | * | 8/2008 | Zhu et al. ........................ 363/17 |

FOREIGN PATENT DOCUMENTS

| JP | 2005-110406 | 4/2005 |
| JP | 2006-180578 | 7/2006 |

* cited by examiner

*Primary Examiner* — Jenny L Wagner
*Assistant Examiner* — Michael P. McFadden
(74) *Attorney, Agent, or Firm* — Nixon & Vanderhye P.C.

(57) ABSTRACT

A power converter is described which is comprised of a filter circuit component including a reactor and capacitor wherein the reactor includes a core which consists of a magnetic substance which is disposed around a conductive wiring member, a noise generating component which radiates noise wherein the noise generating components are disposed adjacently to the filter circuit component and a shielding plate which shields out the radiating noise. The shielding plate is disposed between the filter circuit component and the noise generating component. The conductive wiring member and the shielding plate are composed as one body electrically insulated from each other.

22 Claims, 12 Drawing Sheets

POWER CONVERTER

CROSS-REFERENCE TO RELATED APPLICATION

This application is based on and claims the benefit of priority from earlier Japanese Patent Application No. 2011-157323 filed Jul. 18, 2011, the description of which is incorporated herein by reference.

BACKGROUND

1. Technical Field

The present invention relates to a power converter which provided with a filter circuit.

2. Related Art

For example, patent document JP-A-2006-180578 and JP-A-2005-110406 respectively discloses a power converter such as a DC-DC converter in which an input filter circuit and/or an output filter circuit are provided. In the converter, an input filter circuit portion (component) $90a$, power conversion circuit portion $90b$ and an output filter circuit portion $90c$ are disposed on a circuit board $93$ as shown in FIG. 12.

The power conversion circuit portion $90b$ is a portion which mainly functions as the power converter, and conducts voltage transformation and so on. Both the input-filter circuit portion $90a$ and the output-filter circuit component $90b$ reduce conduction noise which travels through wiring on the circuit board. For example the input-filter circuit component $90a$ reduces conduction noise which gets mixed with the power conversion circuit portion $90b$ from the outside of the power converter $9$. The output-filter circuit portion $90c$ reduces conduction noise which is output from the power conversion circuit portion $90b$ by both filter circuit portion $90a$ and $90b$, thereby the conduction noise from output voltage can be reduced.

However one or more electronic components within the power conversion circuit portion $90b$ radiate noise and then the radiation noise spreads in space S and may affect the filter circuit component $90a$ and $90b$. Thus there is a problem that noise reduction effects by the filter circuit component $90a$ and $90b$ are lowered. In the prior art, as this countermeasures, the power converter $9$ prevents the radiation noise from propagating into the filter circuit component $90a$ and $90b$ in such a manner that each of the input-filter circuit component $90a$, the power conversion circuit portion $90b$ and the output-filter circuit component $90c$ were covered with respective shield case $92$.

However the conventional power converter $9$ has a problem that not only production costs rise due to increase of amount of parts or components and of the manpower for its assembly but also the size of the power converter $9$ enlarges caused by the one or more shield case $92$ which is unacceptable.

Hence, in the light of conditions set forth above, it is needed to provide such a power converter that production costs can be lowered and downsizing of the power converter can be done.

SUMMARY

The Present embodiment presents a power converter which is comprised of a filter circuit component including a reactor and capacitor wherein the reactor includes a core which consists of a magnetic substance which is disposed around a conductive wiring member, a noise generating component which radiates noise wherein the noise generating components are disposed adjacently to the filter circuit component and a shielding plate which shields out the radiating noise. The shielding plate is disposed between the filter circuit component and the noise generating component. The conductive wiring member and the shielding plate are composed as one body electrically insulated from each other.

DETAILED DESCRIPTION OF THE PREFERRED EMBODIMENTS

Figure 1:
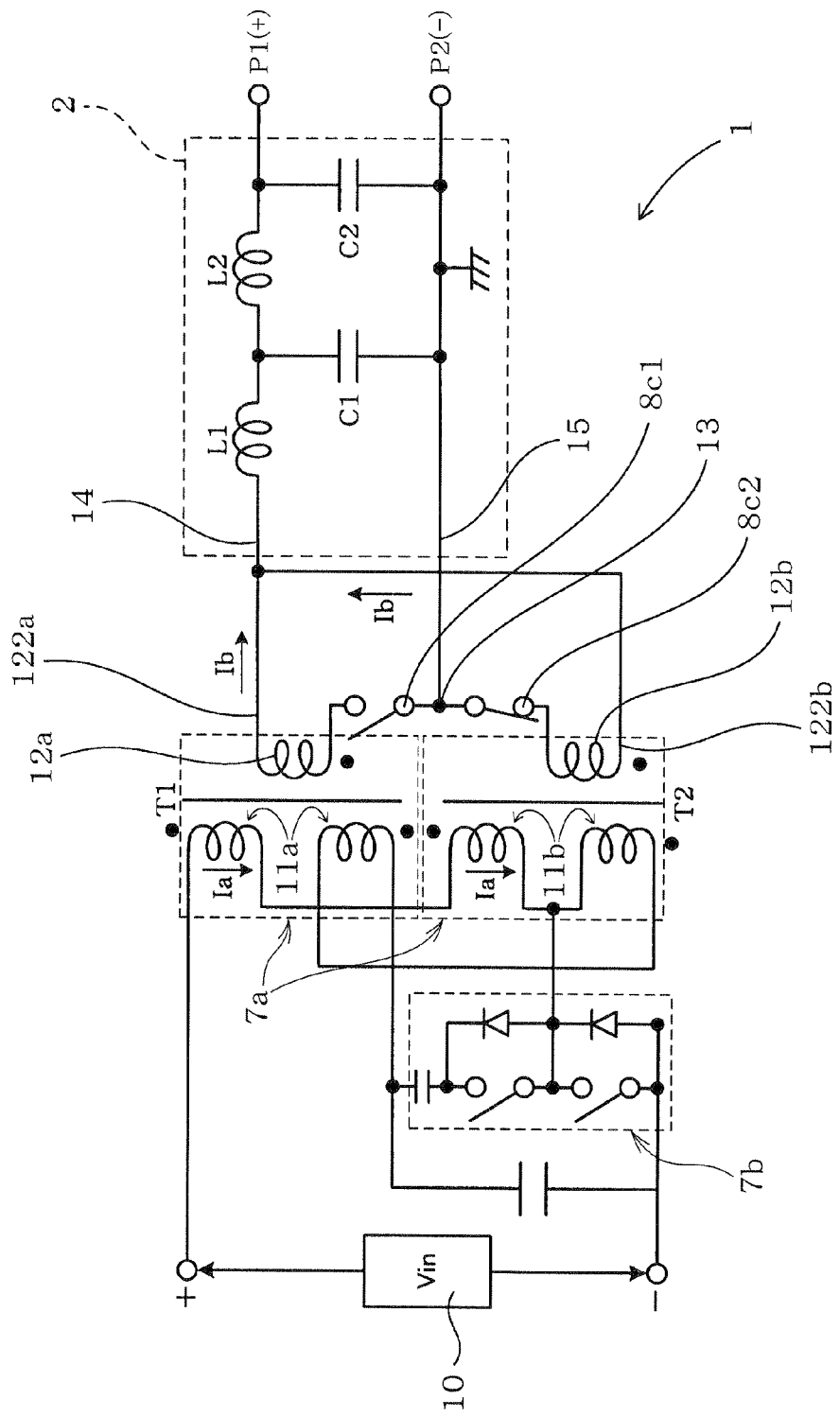
FIG. 1 shows a circuit diagram of a power converter in the first embodiment.

To begin with, the first embodiment of the present invention will be explained with reference to FIG. 1 to FIG. 6. FIG. 1 is a circuit diagram illustrating a power converter according to the exemplary embodiment.

The power converter $1$ is suitable for a DC/DC converter which converts a voltage of DC current $10$. The power converter $1$ provides two transformers T1 and T2, a switching element $7b$ such as an IGBT (Insulated Gate Bipolar Transistor) and a filter circuit component $2$. The transformer T1 provides two primary coils $11a$ and one secondary coil $12a$. The transformer T2 provides two primary coils $11b$ and one secondary coil $12b$. A pulse current (primary current Ia) flows through the primary coil $11a$ and $11b$ by on/off operating of the switching element $7b$. By this a secondary current Ib flows through the secondary coil $12a$ and $12b$.

As shown in FIG. 1, the secondary coil $12a$ and $12b$ are mutually connected at the connecting point $13$. A negative output line $15$ is connected at this connecting point $13$. A positive line $14$ is connected to the secondary coil $12a$ and $12b$ at the opposite side $122a$ and $122b$ against the connecting point $13$. A rectification switching element $8c1$ is disposed between the connecting point $13$ and the secondary coil $12a$. A rectification switching element $8c2$ is disposed between the connecting point $13$ and the secondary coil $12b$. The secondary current Ib can be rectified by the switching element $8c1$ and $8c2$.

A first reactor L1 and a second reactor L2 are serially connected within the positive output line $14$. A first filter capacitor C1 is provided between the first reactor L1 and the second reactor L2 such as the positive output line and the negative output line are thereby connected. A second filter capacitor C12 is provided between the second reactor L2 and a positive output terminal P1 such as the positive output line and the negative output line are thereby connected. A filter circuit component 2 is composed of the reactor L1, L2 and the filter capacitor C1, C2.

Sometimes a surge voltage is generated in the secondary coil 12a of the transformer T1 by the on/off operating of the switching element 7b. Conduction noise caused by the surge voltage may influence in the output line 14 and 15. However the power converter 1 reduces such a conduction noise and prevents the output terminals P1, P2 from radiating large conductive noise therefrom.

Figure 2:
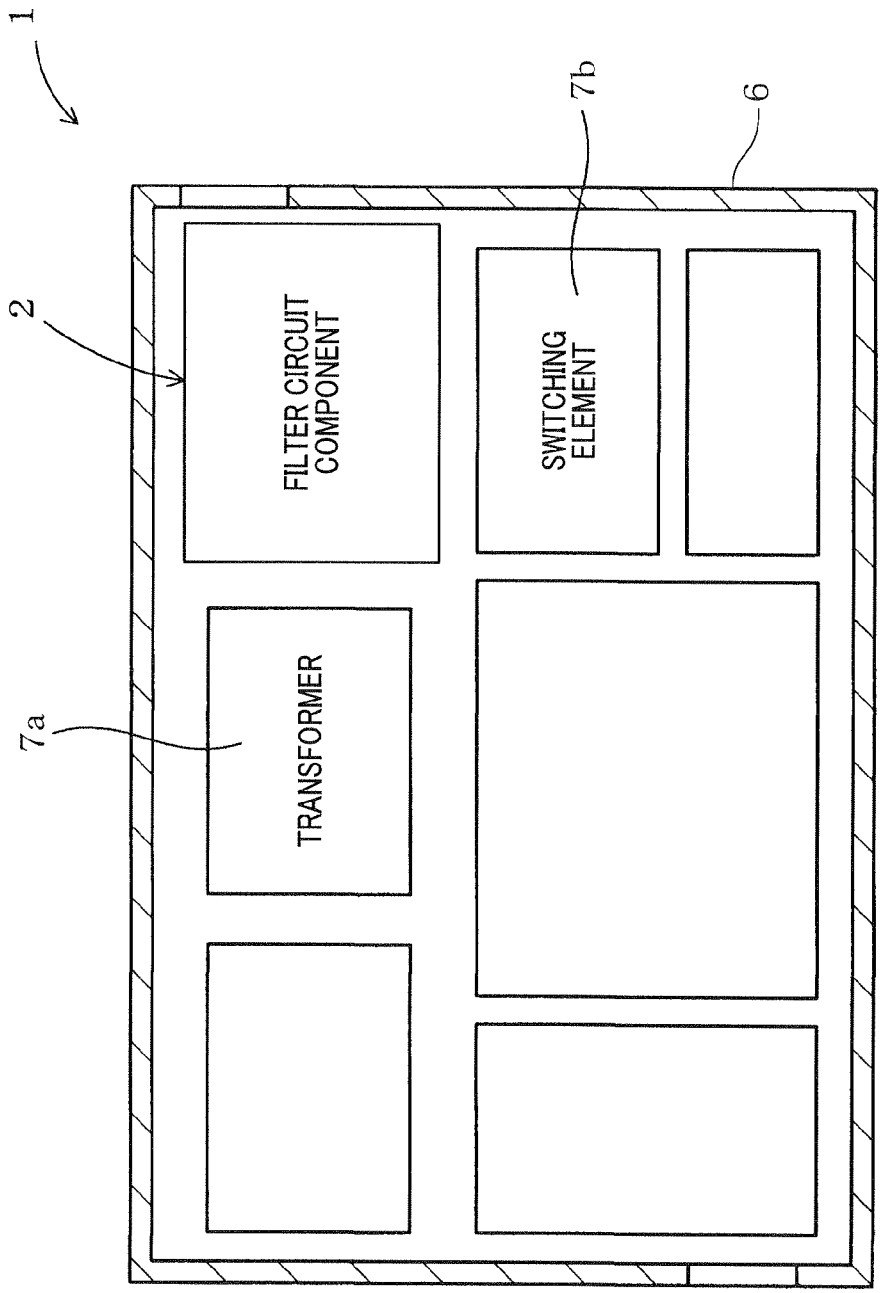
FIG. 2 shows an entirely plane figure of a power converter of the first embodiment.

As shown in FIG. 2, a quadrangle case 6 accommodates the power converter 1. The filter circuit component 2 is disposed at a corner in the case 6. Both the transformer 7a and the switching element 7b are noise generating components. These are disposed adjacently to the filter circuit component 2.

Figure 3:
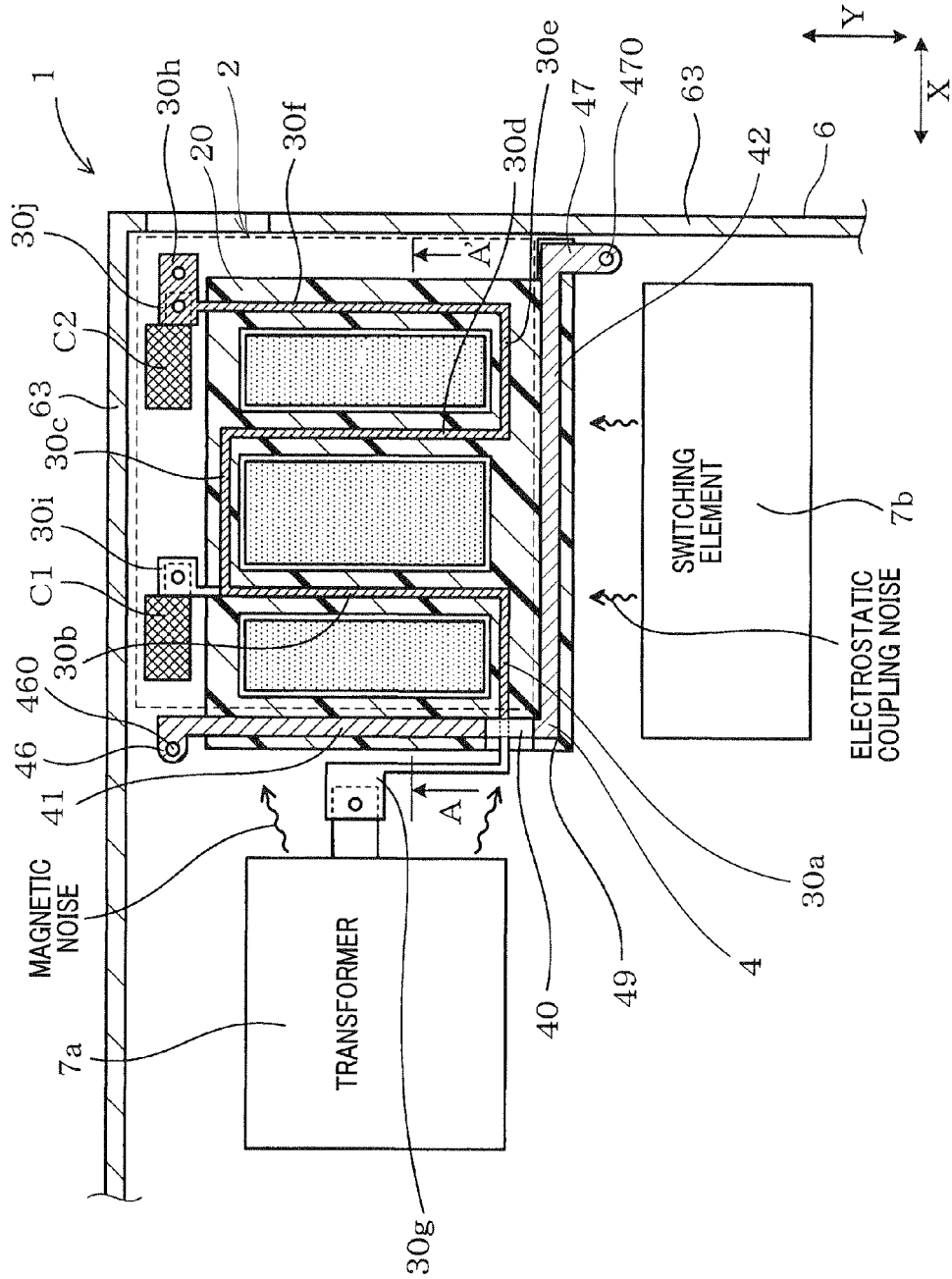
FIG. 3 shows a partially perspective top view of a power converter of the first embodiment.

FIG. 3 shows a perspective top view of the filter circuit component 2 physically composed. In FIG. 3, the power converter 1 provides the filter circuit component 2, one or more noise generating component 7 (7a, 7b) and a shielding plate 4, wherein the filter circuit component 2 includes reactors L1, L2 and the filter capacitors C1, C2. The reactors L1 and L2 are composed in such a manner that a core 31 being consisted of magnetic substance is disposed around the conductive wiring member 30. In detail, the first reactor L1 is composed of a second portion 30b of a conductive wiring member 30 and core 31, also the second reactor L2 is composed of a fourth portion 30d of a conductive wiring member 30 and core 31, that will be later mentioned. The shielding plate 4 may be disposed between the filter circuit component 2 and the noise generating component 7 (7a, 7b). The shielding plate 4 shields out radiated noise radiated at the noise generating component 7 (7a, 7b).

The radiated noise includes both a magnetic noise and an electrostatic coupling noise caused by electrostatic coupling between electronic components within the converter 1. In this embodiment, the transformer 7a and the switching element 7b corresponds to the noise generating component 7. The transformer 7a mainly radiates the magnetic noise and the switching element 7b mainly radiates the electrostatic coupling noise.

As shown in FIG. 3, the shielding plate 4 provides a first portion 41 and a second portion 42, wherein the first plate 41 lies at right angles to the second portion 42. The first portion 41 is disposed between the transformer 7A and the filter circuit component 2. The second portion 42 is disposed between the switching element 7b and the filter circuit component 2.

As shown in FIG. 3, the conductive wiring member 30 provides a first portion 30a, a second portion 30b, a third portion 30c, a fourth portion 30d, a fifth portion 30e, a sixth portion 30f, transformer connecting member 30g and an output terminal 30h. The transformer connecting member 30g is a terminal to connect a transformer 7a. The first portion 30a connects with the transformer connecting member 30g throughout an opening portion 40 which disposed at the first portion 41 of the shielding plate 4. The first portion 30a connects with the transformer connecting terminal 30g in series and extends to X direction. The second portion 30b connects with the first portion 30a as being a series and extends to Y direction toward the first filter capacitor C1.

As shown in FIG. 3, the tip of the second portion 30b provides a first filter capacitor connecting terminal 30i for connecting the first filter capacitor C1. The third portion 30c connects with the second portion 30b as in series and extends to X direction. The fourth portion 30d connects with the third portion 30c in series and extends to Y direction toward the switching element 7b. The fifth portion 30e connects with the fourth portion 30d in series and extends to X direction. The sixth portion 30f connects with the fifth portion 30e in series and extends to Y direction toward the second filter capacitor C2. The tip of the sixth portion 30f provides both the second filter capacitor connecting terminal 30j for connecting the second filter capacitor C2 and the output terminal 30h.

The first portion 41 and the second portion 42 of the shielding plate 4 and from the first portion 30a to the sixth portion 30f of the conductive wiring member 30 are almost completely hermetically sealed within sealing member(s) 20 made of insulating (i.e. electric non-conductive) resin excepting some partial sections.

Figure 4:
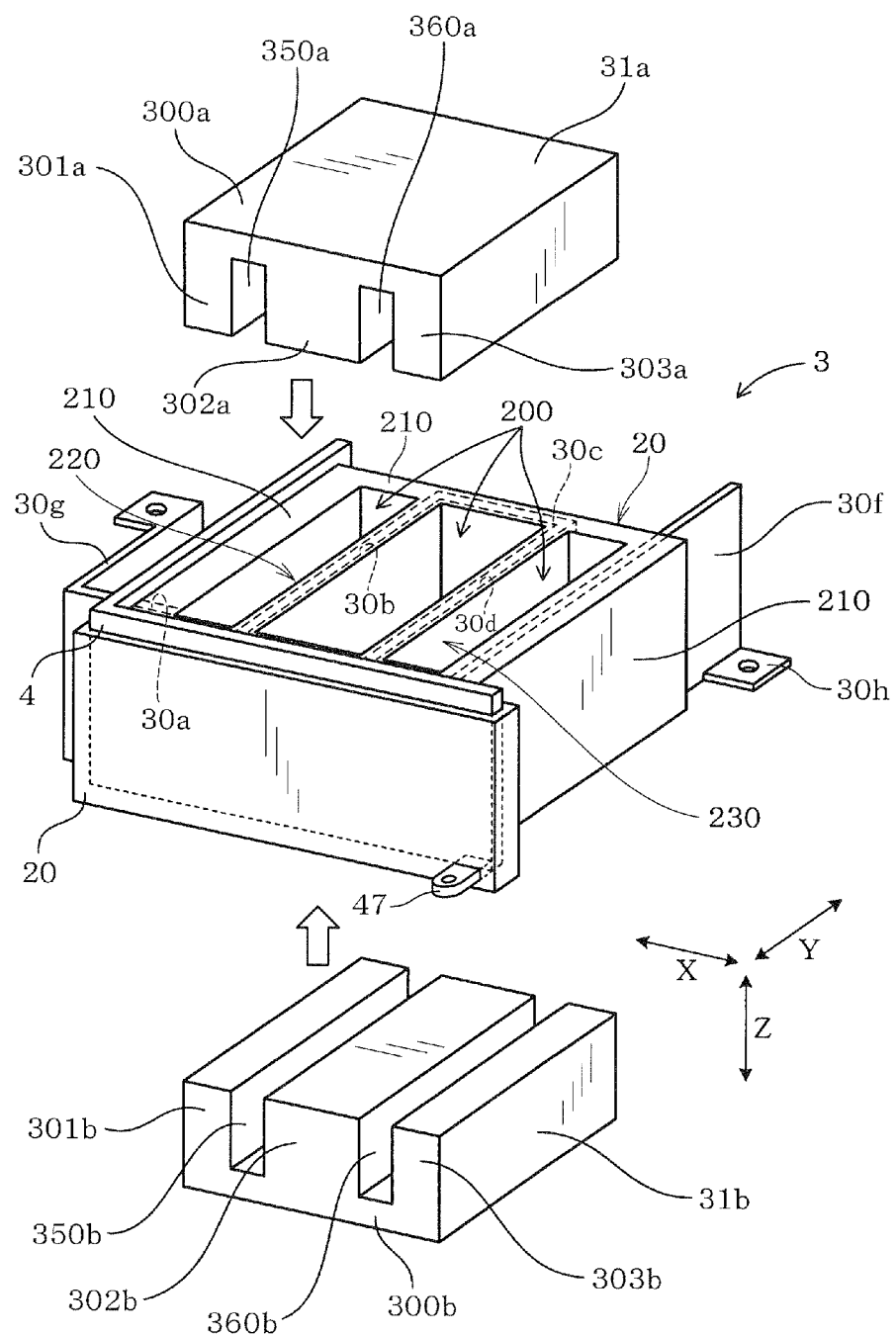
FIG. 4 shows an exploded perspective illustration of a reactor and a shielding plate in the first embodiment.

As shown in FIG. 4, the sealing member(s) provides an outer wall 210 and a pair of inner walls 220 and 230. The inner walls 220 seal the second portion 30b of the conductive wiring member 30. The inner walls 230 seal the fourth portion 30d of the conductive wiring member 30. Three open holes 200 are formed between the outer wall 210 and inner walls 220, 230, still more between the inner wall 220 and the inner wall 230.

The core 31 is composed of an upper core member 31a and a lower core member 31b, both of them respectively consist of a magnetic member. The upper core member 31a provides a main member 300a and three salient 301a, 302a and 303a. The lower core member 31b also provides a main member 300b and three salient 301b, 302b and 303b. The upper core member 31a provides grooves 350a and 360a between the three salient along Y direction. The lower core member 31b also provides grooves 350b and 360b between the three salient along Y direction.

One can easily assemble the reactor L1, L2 by inlaying the salient 301a, 302a and 303a of the upper core member 31a into the open hole 200 of the sealing member 20 from upper direction, still more easily by inlaying the salient 301b, 302b and 303b of the lower core member 31b into the open hole 200 of the sealing member 20 from lower direction as shown FIG. 4. Then one makes each apical surface of the salient 301a, 302a and 303a respectively contact to the apical surface of the salient 301b, 302b and 303b.

Figure 5:
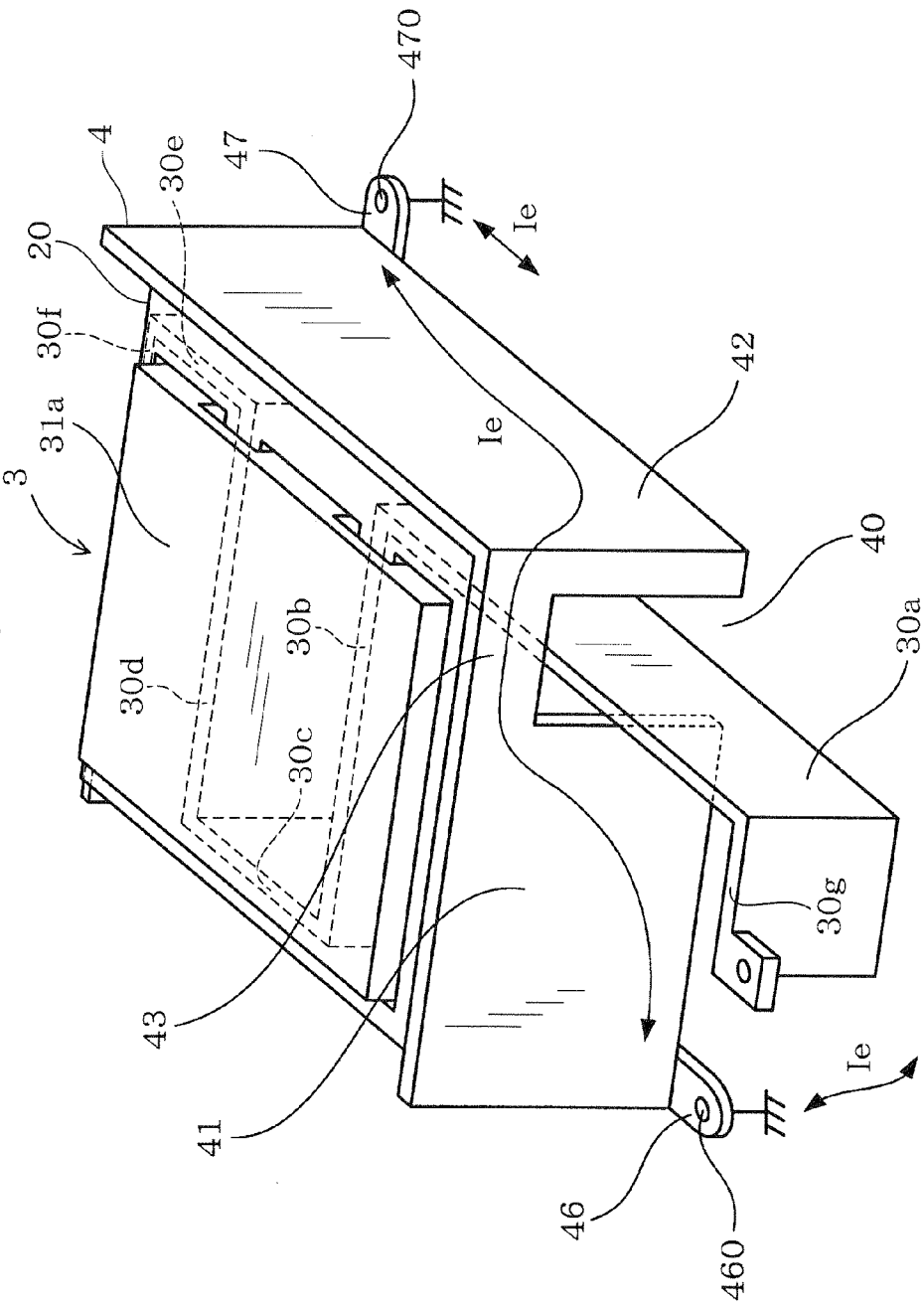
FIG. 5 shows a schematic drawing of a reactor and a shielding plate in the first embodiment.

As shown FIG. 5, the shielding plate 4 includes the first portion 41, the second portion 42 and bridging portion 43. The bridging portion 43 bridges between the first portion 41 and the second portion 42. The opening portion 40 is formed between the first portion 41 and the second portion 42 of the shielding plate 4. The first portion 30a of the conductive wiring member 30 passes through the opening portion 40. As shown in FIG. 3 and FIG. 5, the opening portion 40 is opening toward a direction of the transformer 7a. In FIG. 5, the sealing member 20 is omitted only from the shielding plate 4 as a matter of convenience.

The transformer connecting member 30g is not sealed in the sealing member 20 and disposed between the first portion 41 of the shielding plate 4 and transformer 7a.

The first portion 41 of the shielding plate 4 is fixed to the case 6 and provides a first fixing portion 46 for earth. The second portion 42 of the shielding plate 4 is also fixed to the case 6 and provides a second fixing portion 47 for earth. In the first fixing portion 46, a bolt inserting hole 460 is formed. Also in the second fixing portion 47, a bolt inserting hole 470 is formed. The shielding plate 4 is fixed to the case 6 in such a manner that a bolt is fixed into the bolt inserting holes 460 and 470. The case 6 can be earthed by being connected to a body of a vehicle.

Figure 6:
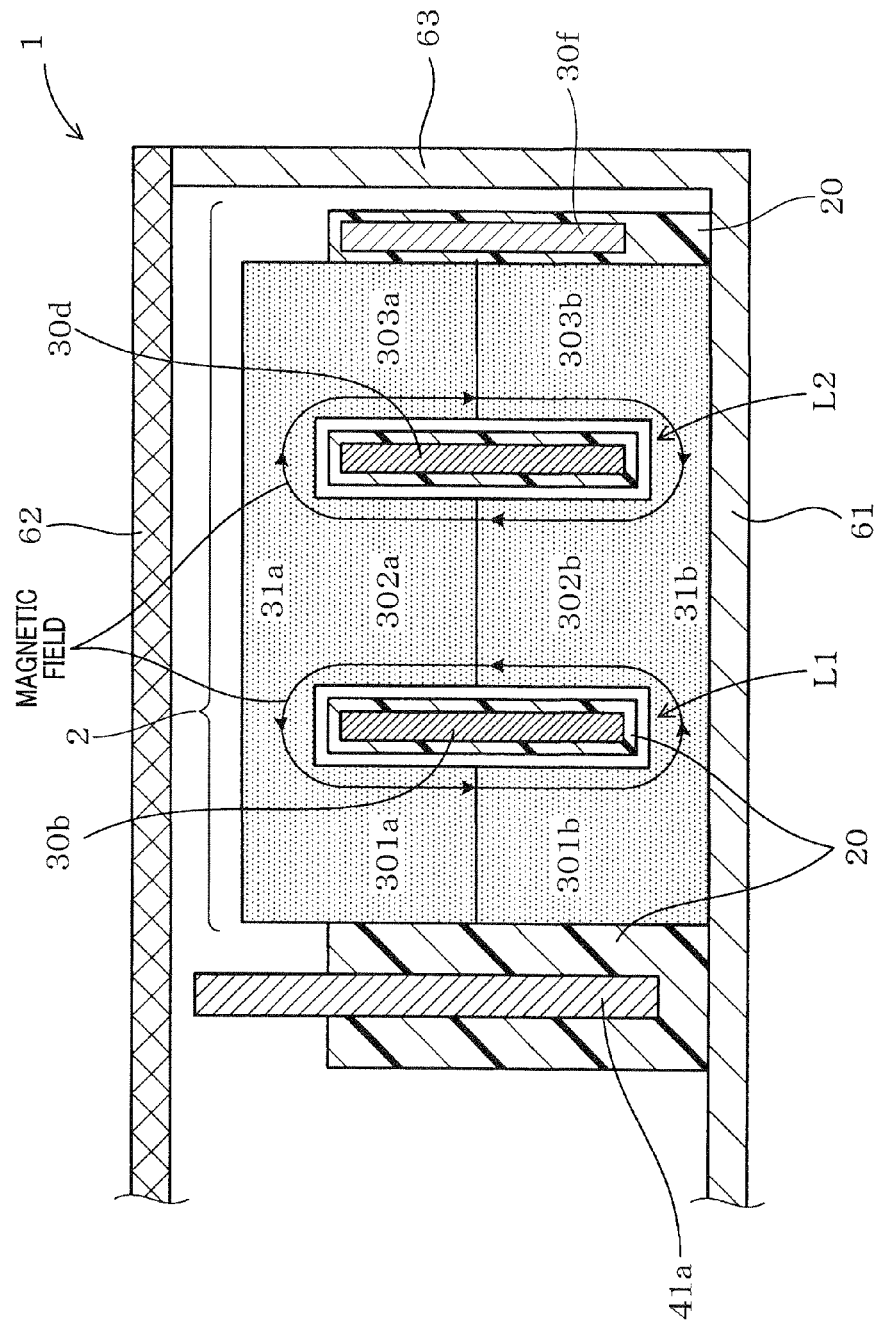
FIG. 6 shows an A-A' cross section in FIG. 3.

FIG. 6 shows an A-A' cross section in FIG. 3. As shown in FIG. 6, the case 6 provides a bottom portion 61, a wall portion 63 and a lid 62. The filter circuit component 2 is surrounded by the bottom portion 61, the wall portion 63, a lid 62 and the shielding plate 4. These surrounding components protect the filter circuit component 2 by shielding the noise emitted from the transformer 7a and switching element 7b.

As shown in FIG. 6, the reactor L1 and L2 are composed in such a manner that a core 31 consists of magnetic member is disposed around the conductive wiring member 30. In detail, the first reactor L1 is composed of a second portion 30b of a conductive wiring member 30 and core 31, also the second reactor L2 is composed of a fourth portion 30d of a conductive wiring member 30 and core 31. A magnetic field may be generated within the core 31 during current flows in the conductive wiring member 30. Therefore the second portion 30b and the fourth portion 30d of the conductive wiring member 30 function like a coil.

Figure 12:
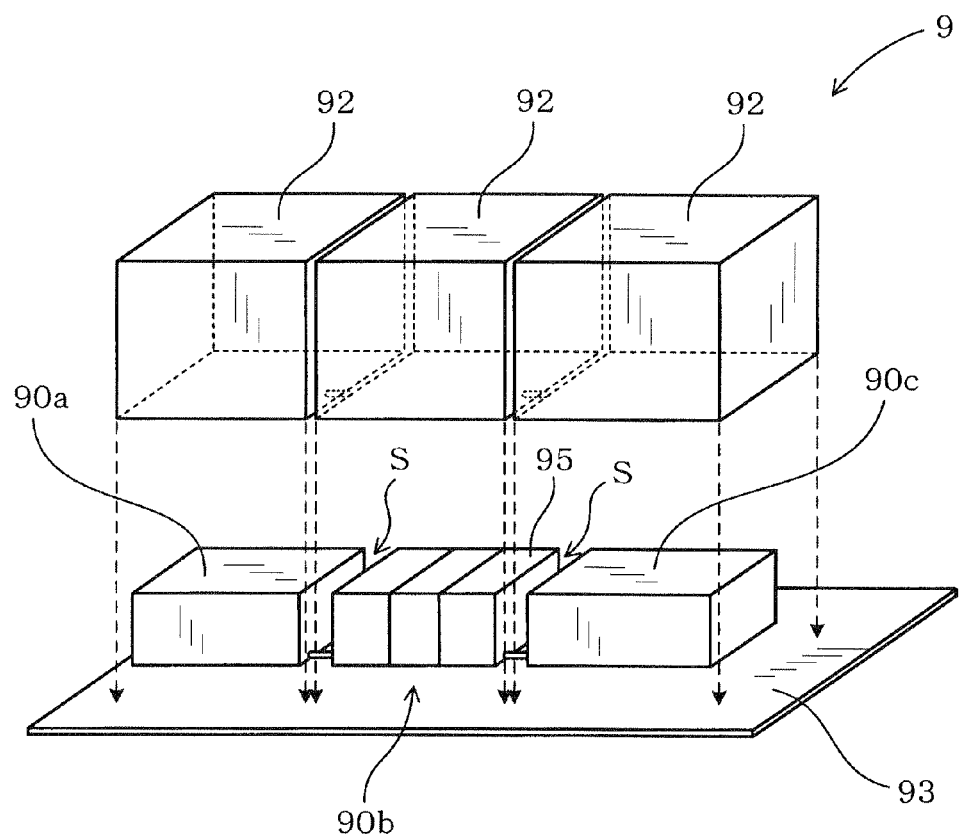
FIG. 12 shows an exploded perspective illustration of the power converter according to the prior art.

The advantages of the above mentioned embodiment will be mentioned below. As shown in FIG. 3 and FIG. 4, in the power converter 1, the conductive wiring member 30 and the shielding plate 4 are composed as one body electrically insulated from each other. Thereby one can reduce the number of parts for assembling of the power converter 1 because it is not necessary that one supplies the conductive wiring member 30 and shielding plate 4 separately, and also one can reduce both the cost of parts and the assembly cost. Still more, downsizing of the power converter can be done because it is not necessary that one covers each component by housing 92 as shown FIG. 12. An assemble manpower also can be reduced because one can assemble the reactor L1 and L2 by only inlaying the upper core member 31a and the lower core member 31b into the sealing member 20.

As shown in FIG. 3, the power converter 1 provides the transformer 7a (T1 and T2) as one of the noise generating components 7. The transformer 7a has a tendency to emit noise. However the power converter 1 can efficiently protect the filter circuit component 2 from the radiated noise by the transformer 7a even though the transformer 7a is disposed in the vicinity of the filter circuit component 2 because the shielding plate 4 is efficiently able to shield the radiated noise.

The power converter 1 also provides the switching element 7b as one of the noise generating components 7. The switching element 7b has a tendency to emit noise. However the power converter 1 can efficiently protect the filter circuit component 2 from the radiated noise produced by the switching element 7b even though the switching element 7b is disposed in the vicinity of the filter circuit component 2 because the shielding plate 4 is efficiently able to shield the radiated noise.

In case of the power converter 1, shielding plate 4 consist of such a material which provides at least either electrically conductive nature or magnetic properties. Thereby the shielding plate 4 can efficiently shield the noise emitted from the noise generating component 7. For example, in a case that the shielding plate 4 consists of a conductive material, the shielding plate 4 can efficiently shield an electrostatic coupling noise even though the electrostatic coupling noise may be emitted from the noise generating component 7 because an electrostatic coupling shielding effect may result in the shielding by shield plate 4. Still more, in a case that the shielding plate 4 consists of a magnetic material, the shielding plate 4 can efficiently shield such a magnetic noise even though the magnetic noise may be emitted from the noise generating component 7 because a magnetic shielding effect may result shielding by in the shield plate 4.

Further as shown in FIG. 5, the shielding plate 4 provides an opening portion 40. Thereby the conductive wiring member 30 can be disposed such as pass through the opening portion 40. This structure allows a route for connecting the reactor (L1 and L2) to other component such as noise generating component 7 to be shorter.

Even through the opening portion is provided in the shielding plate 4, the power converter 1 can prevent the magnetic noise from reaching the filter circuit component 2 through the opening portion 40.

The reason is as follows. At the time when the magnetic noise passes through the opening portion 40, an eddy current Ie flows on the route within the first portion 41 of the shielding plate 4 and the bridging portion 43 and the second portion 42 of the shielding plate 4 and earth portion (i.e. the case 6 or a body of the vehicle) because both the first portion 41 and the second portion 42 of the shielding plate 4 are earthed. A magnetic field generated around the eddy current Ie restrain the inroads of the magnetic noise into the opening portion 40. That is, the filter circuit portion 2 is not easily affected by magnetic noise. As shown in FIG. 3 and FIG. 5, since the opening portion 40 is structurally disposed toward the transformer 7a, the merit that the eddy current Ie flows between the first portion 41 and second portion 42 within the shielding plate 4 especially should be considered.

Though this power converter 1 is available for any kind of use, this power converter 1 is especially available for vehicle such as electric cars and/or hybrid cars, because power converters for vehicles are needed for its cost down and downsizing.

According to the afore-mentioned embodiment, one can not only reduce manufacturing cost but also can provide downsized power converter.

Figure 7:
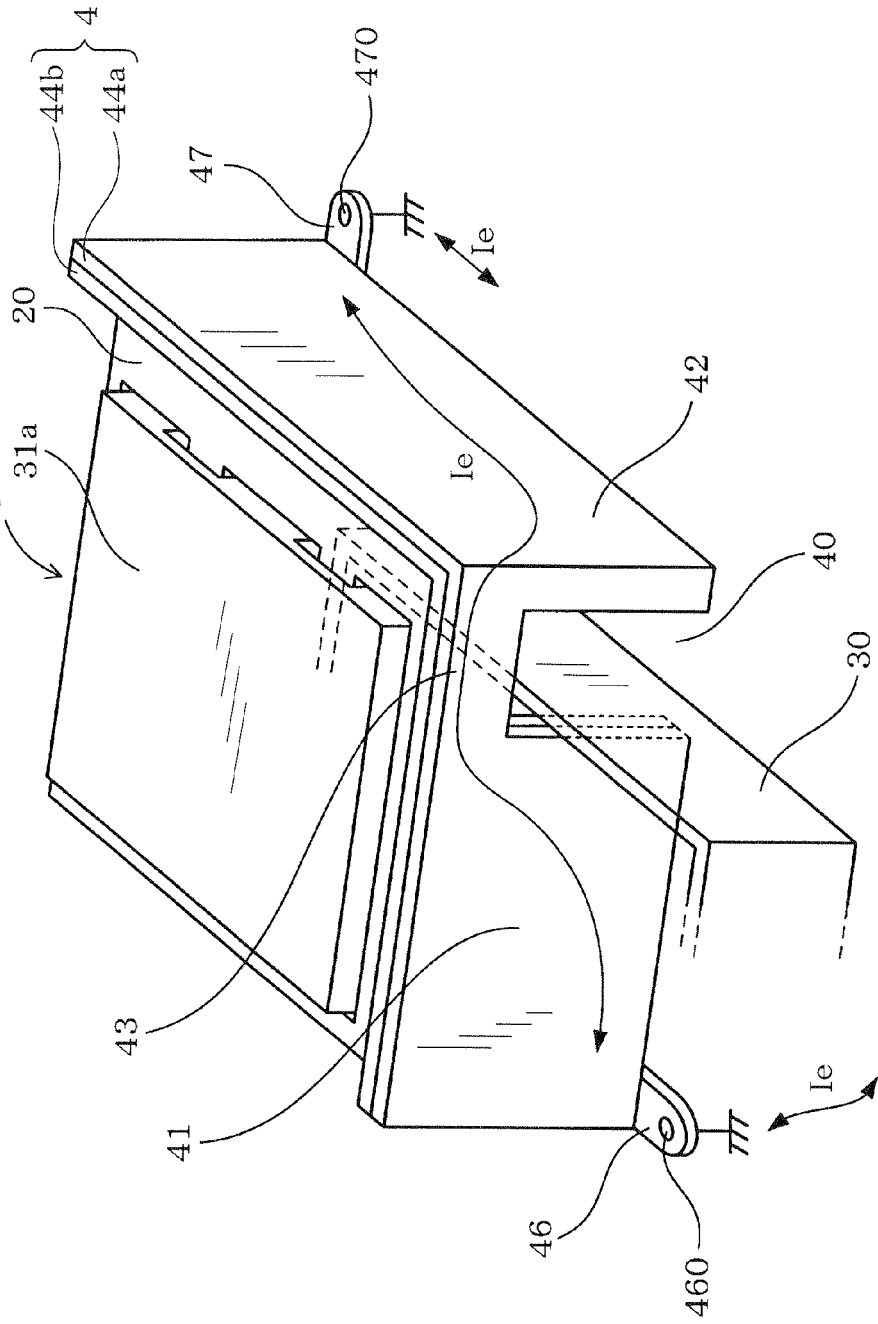
FIG. 7 shows a schematic drawing of a reactor and a shielding plate in the second embodiment.

The alternative embodiment of the shielding plate 4 is shown in FIG. 7. As shown in FIG. 7, the shielding plate 4 is constructed using two members 44a and 44b for shielding. The two members are mutually stuck firmly. The member 44a is electrically conductive nature. Another member 44b is magnetic properties so as to provide magnetic properties.

The shielding plate 4 can much more sufficiently shield the radiated noise since one can make the thickness of the shielding plate 4 very thick. Still more, since the conductive shielding member 44a which and the magnetic shielding member 44b are mutually stuck firmly, the shielding plate 4 can much more sufficiently shield the radiated noise. That is, the shielding member 44a can reduce the influence of the electrostatic coupling noise and the shielding member 44b can reduce the influence of the magnetic noise. Accordingly the filter circuit component 2 is not easily affected by the electrostatic coupling noise and the magnetic noise.

The shielding plate 4 may be constructed of one plate which provides both the electrostatic coupling nature and the magnetic properties. Further the shielding plate 4 may be constructed by three or more than three plates.

Figure 8:
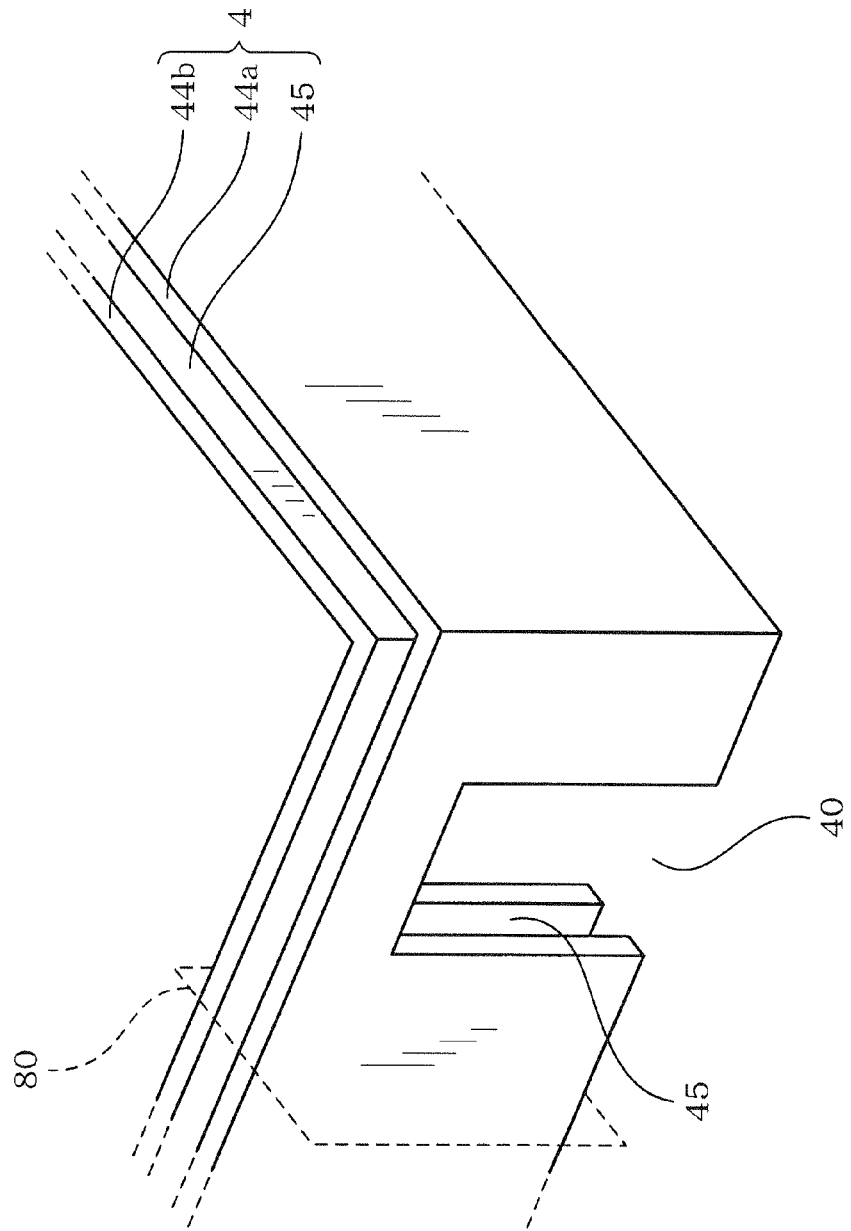
FIG. 8 shows an enlarged oblique drawing of the shielding plate in the third embodiment.
Figure 9:
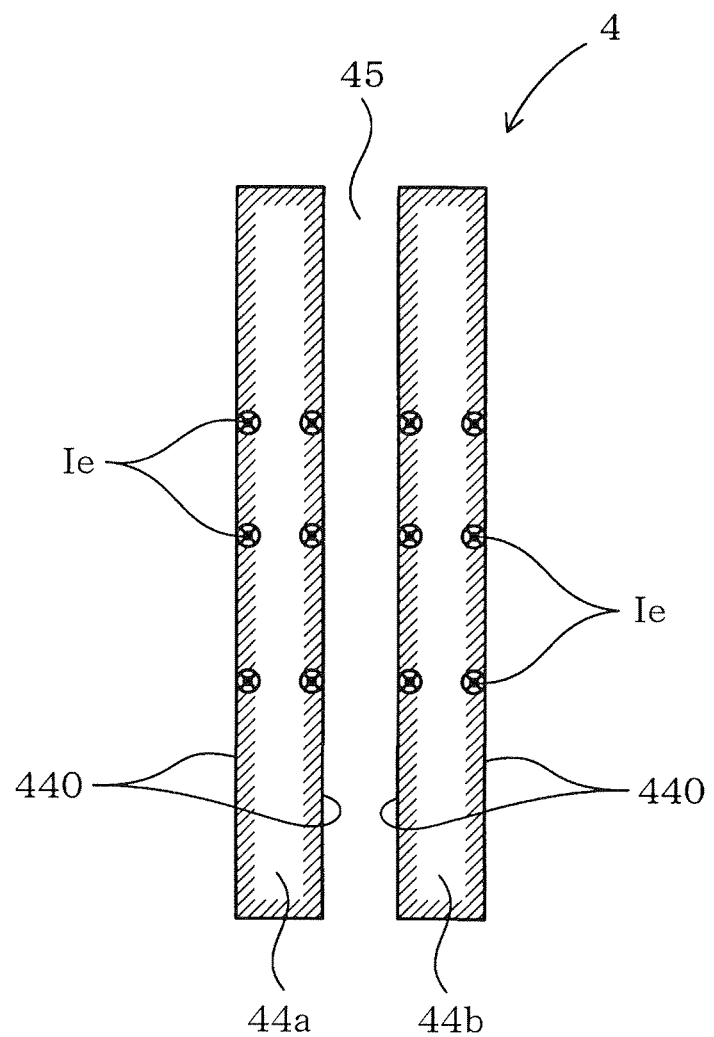
FIG. 9 shows a cross section of the shielding plate in the third embodiment.

Further an alternative embodiment of the shielding plate 4 is shown in FIG. 8. As shown in FIG. 8, the shielding plate 4 is constructed using two members 44a and 44b for shielding. The two members are disposed as facing each other. A space 45 exists between member 44a and member 44b. The member 44a is electrically conductive nature. Another member 44b provides magnetic properties, i.e. magnetic shielding nature. The cross section of the shielding plate 4 expressed by 80 in FIG. 8 are shown in FIG. 9. As shown in FIG. 9, in the case that the space 45 exists between member 44a and member 44b, eddy current Ie is generated caused by the "skin effect" on a surface 440 of the member 44a and 44b.

Further, in the case that the space 45 exists between member 44a and member 44b, total surface area of the shielding plate 4 is enlarged, thereby eddy current Ie may increase.

Accordingly the shielding plate 4 of this embodiment can much more sufficiently shield the magnetic noise.

In this embodiment, as shown in FIG. 8, since the space 45 exists at the opening portion 40, much more eddy currents Ie may be generated around the opening portion 40. Thereby the shielding plate 4 can reduce the amount of the magnetic noise which intrudes into the opening portion 40.

Still more, in this embodiment, since the shielding plate 4 has the conductive member 44a and the magnetic member 44b, the shielding plate 4 can efficiently shield the radiated noise as same as afore mentioned embodiment with reference to FIG. 7. That is, the shielding member 44a can reduce the influence of the electrostatic coupling noise and the shielding member 44b can reduce the influence of the magnetic noise. Accordingly the filter circuit component 2 is not easily affected by the electrostatic coupling noise and the magnetic noise.

Further in this embodiment, both plate member 44a and 44b may provide both electrically conductive nature and magnetic shielding nature. Still more, one or more plate member may be disposed as providing space as same as mentioned above.

Figure 10:
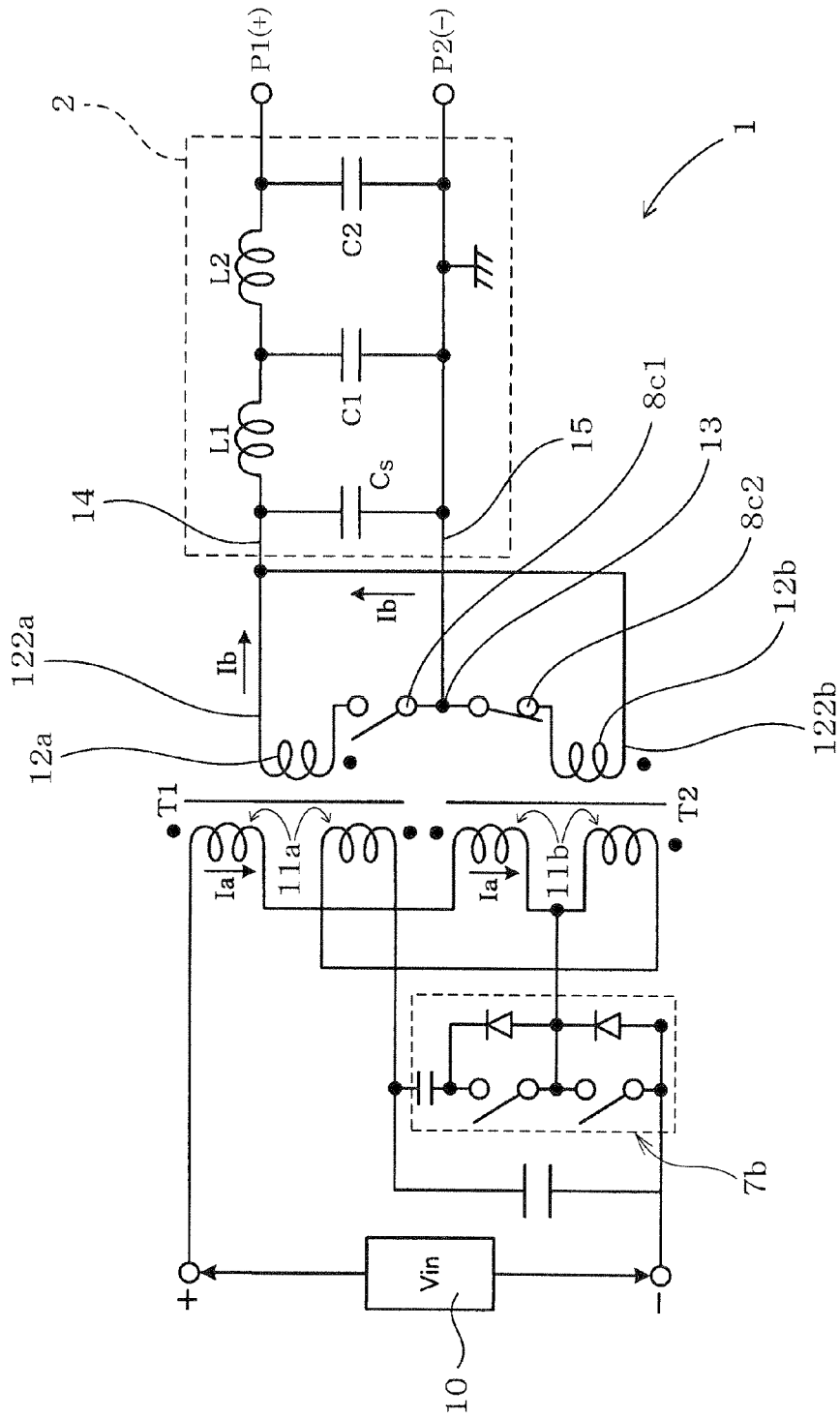
FIG. 10 shows a circuit diagram of the power converter in the fourth embodiment.

The alternative embodiment of the filter circuit component 2 is shown in FIG. 10. As shown in FIG. 10, the filter circuit component 2 provides a smoothing capacitor Cs as well as filter capacitor C1 and C2. The smoothing capacitor connects positive output line 14 and negative output line 15 near the transformer T1 and T2 more than the capacitor C1 and C2. The smoothing capacitor Cs may make the secondary voltage of the secondary coil 12a and 12b smooth. The filter circuit component 2 shall be composed of the reactor (L1, L2), the filter capacitor (C1, C2) and the smoothing capacitor Cs.

Figure 11:
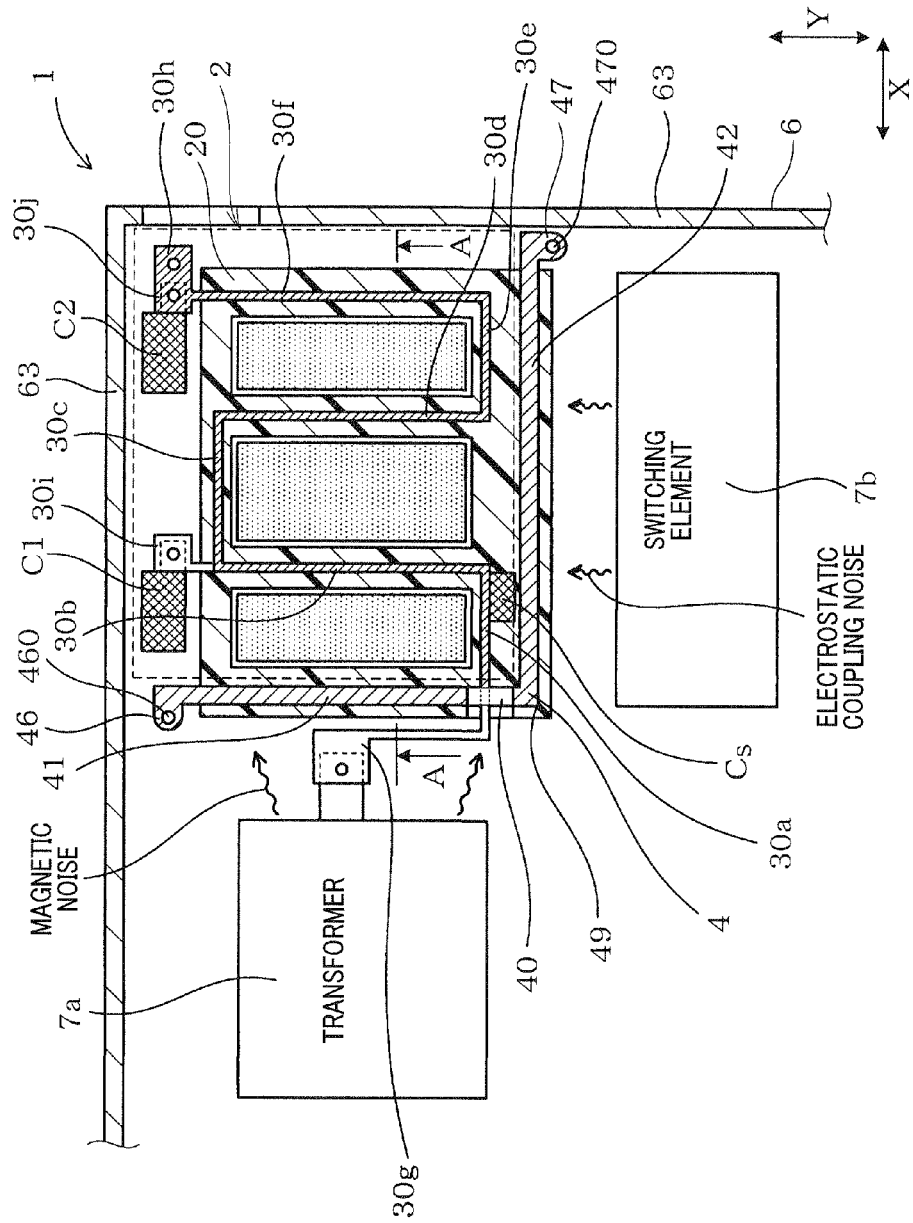
FIG. 11 shows a partially prospective top view of the power converter in the fourth embodiment.

FIG. 11 shows a partially prospective top view of the power converter in this embodiment. As shown in FIG. 11, the shielding plate 4 is disposed between the smoothing capacitor Cs and the noise generating component 7 (7a, 7b). The smoothing capacitor Cs connects the first portion 30a of the conductive member 30.

According to this embodiment, using the shielding plate 4, the smoothing capacitor Cs in the filter circuit component 2 can be protected from the radiated noise. Therefore the smoothing capacitor Cs may not be easily affected by the radiated noise, thereby one can effectively eliminate a ripple included in the output voltage.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A power converter comprising;
a filter circuit component including a reactor and capacitor, wherein the reactor includes a conductive wiring member which acts as a coil and a core composed of a magnetic substance which is disposed around and covers the conductive wiring member; a circuit provided with a noise generating component which radiates noise when the noise generating component is made active, wherein the noise generating component is positioned adjacently to the filter circuit component, the generated noise including at least magnetic noise or electrostatic noise; and a shielding plate which shields the noise radiated from the noise generating component, wherein the shielding plate is formed to have a plate surface, is built between the filter circuit component and the circuit provided with the noise generating component such that the plate surface is opposed to the circuit provided with the noise generating component, and is earthed; wherein both of the conductive wiring member and the shielding plate are formed as a one body in which both of the conductive wiring member and the shielding plate are electrically insulated from each other.

2. A power converter according to claim 1, wherein the shielding plate is composed of material which is at least electrically conductive or magnetic.

3. A power converter according to claim 2, wherein the shielding plate comprises a first portion, a second portion and a bridging portion, wherein the shielding plate is at least electrically conductive, the bridging portion mechanically connects the first portion and the second portion with each other, and both the first portion and the second portion are earthed.

4. A power converter according to claim 3, wherein the shielding plate comprises plural shielding members which are stacked on one another to form a multiple layer structure.

5. A power converter according to claim 1, wherein the shielding plate comprises a first portion, a second portion and a bridging portion, wherein the shielding plate is at least electrically conductive, the bridging portion mechanically connects the first portion and the second portion with each other, and both the first portion and the second portion are earthed.

6. A power converter according to claim 5, wherein the shielding plate provides an opening through which a part of the conductive wiring member passes, and the opening is formed under the bridging portion.

7. A power converter according to claim 1, wherein the shielding plate comprises plural shielding members which are stacked on one another to form a multiple layer structure.

8. A power converter according to claim 1, wherein the shielding plate comprises plural shielding plates which are disposed parallel with each other with, a spacing being provided between two of the plural shielding plates.

9. A power converter according to claim 1, wherein the filter circuit component includes both a filter capacitor which eliminates conduction noise and a smoothing capacitor which smoothens voltage inputted to the filter circuit component.

10. A power converter according to claim 1, comprising an electrically insulating shielding member,
wherein the shielding member holds both of the conductive wiring member and the shielding plate as the one body such that the conductive wiring member and the shielding plate are spatially separated from each other and held by the shielding member.

11. A power converter according to claim 10, wherein the circuit provided with the noise generating component is at least one of a transformer or a circuit with a switching element.

12. A power converter according to claim 11, wherein the shielding plate is composed of material which at least has one of electrically conductive nature or magnetic properties.

13. A power converter according to claim 12, wherein the shielding plate comprises a first portion, a second portion and a bridging portion, wherein the shielding plate is at least electrically conductive, the bridging portion mechanically connects the first portion and the second portion with each other, and both the first portion and the second portion are earthed.

14. A power converter according to claim 13, wherein the shielding plate provides an opening through which a part of the conductive wiring member passes, and the opening is formed under the bridging portion.

15. A power converter according to claim 14, wherein the shielding plate comprises plural shielding members which are stacked on one another to form a multiple layer structure.

16. A power converter according to claim 14, wherein the shielding plate comprises plural shielding plates which are disposed parallel with each other with, a spacing being provided between two of the plural shielding plates.

17. A power converter according to claim 15, wherein the plural shielding plates include an electrically conductive plate and a magnetic member plate.

18. A power converter according to claim 15, wherein the plural members are formed to show both electrical conductive and magnetic properties.

19. A power converter according to claim 18, wherein the filter circuit component includes both a filter capacitor which eliminates conduction noise and a smoothing capacitor which smoothens voltage inputted to the filter circuit component.

20. A power converter according to claim 11, the shielding plate comprises plural shielding members which are stacked on one another to form a multiple layer structure.

21. A power converter according to claim 10, wherein
the shielding plate comprises plural plate portions which are bent but integrated as one plate,
the conductive wiring member comprises plural wiring member portions which are plate-shaped, folded up to have a spacing between folded portions thereof, and integrated as one member,
the plural plate portions are arranged around the folded-up wiring member portions, and
the shielding member fixedly holds, as the one body, both the bent plate portions and the folded-up wring member portions.

22. A power converter according to claim 21, wherein the shielding member fixedly holds both the bent plate portions and the folded-up wring member portions such that the shielding member still provides a spacing of which spatial shape is still in conformity with the spacing formed between the folded portions of the plural wiring member portions,
the core comprises a protrusion of which spatial shape is in conformity with the spacing of the shielding member, the core being assembled with the shielding member such that the protrusion of the core is inserted into the spacing of the shielding member.

* * * * *